US011360512B2

(12) United States Patent
Dabby et al.

(10) Patent No.: US 11,360,512 B2
(45) Date of Patent: Jun. 14, 2022

(54) ELECTRONIC DEVICE FABRIC INTEGRATION

(71) Applicant: Intel Corporation, Santa Clara, CA (US)

(72) Inventors: Nadine L. Dabby, Palo Alto, CA (US); Sasha N. Oster, Chandler, AZ (US); Aleksandar Aleksov, Chandler, AZ (US); Braxton Lathrop, Lake Oswego, OR (US); Racquel L Fygenson, Goleta, CA (US)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 16/567,479

(22) Filed: Sep. 11, 2019

(65) Prior Publication Data

US 2020/0004290 A1 Jan. 2, 2020

Related U.S. Application Data

(62) Division of application No. 15/398,608, filed on Jan. 4, 2017, now abandoned.

(51) Int. Cl.
*H05K 3/30* (2006.01)
*G06F 1/16* (2006.01)
(Continued)

(52) U.S. Cl.
CPC ............ *G06F 1/163* (2013.01); *G06F 1/1656* (2013.01); *H05K 1/0283* (2013.01); *H05K 1/038* (2013.01);
(Continued)

(58) Field of Classification Search
CPC ................. H05K 1/0283; H05K 1/038; H05K 2203/1311; H05K 2203/1383;
(Continued)

(56) References Cited

U.S. PATENT DOCUMENTS 5,672,913 A    9/1997  Baldwin et al.
6,729,025 B2   5/2004  Farrell et al.
(Continued)

OTHER PUBLICATIONS

"U.S. Appl. No. 15/398,608, Advisory Action dated Apr. 16, 2019", 6 pgs.
(Continued)

*Primary Examiner* — Paul D Kim
(74) *Attorney, Agent, or Firm* — Schwegman Lundberg & Woessner, P.A.

(57) ABSTRACT

Systems and methods describe herein provide a solution to the technical problem of creating a wearable electronic devices. In particular, these systems and methods enable electrical and mechanical attachment of stretchable or flexible electronics to fabric. A stretchable or flexible electronic platform is bonded to fabric using a double-sided fabric adhesive, and conductive adhesive is used to join pads on the electronic platform to corresponding electrical leads on the fabric. An additional waterproofing material may be used over and beneath the electronic platform to provide a water-resistant or waterproof device This stretchable or flexible electronic platform integration process allows the platform to bend and move with the fabric while protecting the conductive connections. By using flexible and stretchable conductive leads and adhesives, the platform is more flexible and stretchable than traditional rigid electronics enclosures.

11 Claims, 8 Drawing Sheets

(51) Int. Cl.
　　　*H05K 3/34*　　(2006.01)
　　　*H05K 3/32*　　(2006.01)
　　　*H05K 1/03*　　(2006.01)
　　　*H05K 1/02*　　(2006.01)
　　　*H05K 3/28*　　(2006.01)

(52) U.S. Cl.
　　　CPC ........... *H05K 3/321* (2013.01); *H05K 3/3463* (2013.01); *H05K 3/284* (2013.01); *H05K 2201/0314* (2013.01); *H05K 2203/1311* (2013.01); *H05K 2203/1383* (2013.01)

(58) Field of Classification Search
　　　CPC ...... H05K 3/284; H05K 3/321; H05K 3/3463; H05K 2201/0314; G06F 1/163; G06F 1/656
　　　See application file for complete search history.

(56) References Cited

U.S. PATENT DOCUMENTS

| | | | |
|---|---|---|---|
| 7,461,444 | B2 | 12/2008 | Deaett et al. |
| 8,022,307 | B2 | 9/2011 | Chu et al. |
| 8,116,898 | B2 * | 2/2012 | Chung ............... D04B 1/16 700/141 |
| 9,474,151 | B2 | 10/2016 | Van Os et al. |
| 9,736,936 | B2 | 8/2017 | Jezewski |
| 2002/0076948 | A1 | 6/2002 | Farrell et al. |
| 2007/0149001 | A1 | 6/2007 | Uka |
| 2010/0238636 | A1 | 9/2010 | Mascaro et al. |
| 2011/0128686 | A1 * | 6/2011 | Moreshead ......... D03D 15/00 361/679.01 |
| 2013/0027963 | A1 | 1/2013 | Van Herpen et al. |
| 2014/0070957 | A1 * | 3/2014 | Longinotti-Buitoni ............. G06F 3/011 340/870.01 |
| 2014/0318699 | A1 | 10/2014 | Longinotti-Buitoni et al. |
| 2016/0038083 | A1 | 2/2016 | Ding et al. |
| 2016/0270727 | A1 | 9/2016 | Berg et al. |
| 2017/0094749 | A1 | 3/2017 | Elsherbini et al. |
| 2017/0164461 | A1 | 6/2017 | Lathrop et al. |
| 2017/0196513 | A1 | 7/2017 | Longinotti-Buitoni et al. |
| 2017/0325337 | A1 | 11/2017 | Karagozler et al. |
| 2018/0188771 | A1 | 7/2018 | Dabby et al. |

OTHER PUBLICATIONS

"U.S. Appl. No. 15/398,608, Examiner Interview Summary dated Feb. 13, 2019", 3 pgs.

"U.S. Appl. No. 15/398,608, Examiner Interview Summary dated Sep. 19, 2018", 3 pgs.

"U.S. Appl. No. 15/398,608, Final Office Action dated Dec. 27, 2018", 16 pgs.

"U.S. Appl. No. 15/398,608, Non Final Office Action dated Jun. 6, 2019", 20 pgs.

"U.S. Appl. No. 15/398,608, Non Final Office Action dated Jun. 12, 2018", 13 pgs.

"U.S. Appl. No. 15/398,608, Response filed Mar. 12, 2018 to Restriction Requirement dated Jan. 25, 2018", 7 pgs.

"U.S. Appl. No. 15/398,608, Response Filed Sep. 12, 2018 to Non Final Office Action dated Jun. 12, 2018", 11 pgs.

"U.S. Appl. No. 15/398,608, Response filed Mar. 27, 2019 to Final Office Action dated Dec. 27, 2018", 12 pgs.

"U.S. Appl. No. 15/398,608, Restriction Requirement dated Jan. 25, 2018", 8 pgs.

Buechley, Leah, et al., "Fabric PCBs, electronic sequins, and socket buttons: techniques fore-textile craft", Personal and Ubiquitous Computing, 13(2), (Feb. 2009), 133-150.

Buscher, Gereon H, et al., "Flexible and stretchable fabric-based tactile sensor", Robotics and Autonomous Systems, 63(3), (Jan. 2015), 244-252.

U.S. Appl. No. 15/398,608, filed Jan. 4, 2017, Electronic Device Fabric Integration.

\* cited by examiner

ELECTRONIC DEVICE FABRIC INTEGRATION

This is a division of application Ser. No. 15/398,608 filed Jan. 4, 2017.

TECHNICAL FIELD

Embodiments described herein generally relate to wearable electronic devices.

BACKGROUND

There is an increasing demand for portable and wearable electronic devices. Many wearable electronic devices are attached to clothing by connecting a rigid electronic device enclosure to a wearable fabric (e.g., wearable textile) using metallic snaps, screws, or magnets. Wearable electronic devices may be attached to clothing by installing the electronic device into a rigid plastic casing that is superglued onto the wearable fabric. Wearable electronic devices may also be overmolded onto wearable fabric using thick plastic and adhesive. In each of these examples, the electronic device or enclosure is hard and obtrusive. This is in contrast with the physical characteristics of the fabric itself, which is often stretchable, foldable, and lightweight. It is desirable to provide a wearable electronic device with improved flexibility and stretchability.

DESCRIPTION OF EMBODIMENTS

The systems and methods describe herein provide a solution to the technical problem of creating a wearable electronic devices. In particular, these systems and methods enable electrical and mechanical attachment of stretchable or flexible electronics to fabric or other textiles. The fabrics or other textiles may be used in clothing, upholstery (e.g., car seat cushions), towels, sheets, blankets, protective structures (e.g., umbrellas, awnings), sails, or other fabric or textiles. A stretchable or flexible electronic platform is bonded to fabric using a double-sided fabric adhesive, and conductive adhesive is used to join pads on the electronic platform to corresponding electrical leads on the fabric. An additional waterproofing material may be used over and beneath the electronic platform to provide a water-resistant or waterproof device.

This stretchable or flexible electronic platform integration process allows the platform to bend and move with the fabric while protecting the conductive connections. The resulting structure (e.g., form factor) is significantly lower in profile than snap connections, and enables connecting a significantly increased number of electrical leads in the same amount of space as snap connection implementations. Because the electronic platform and adhesive may both be flexible and stretchable, the platform is more apt to be able to bend and move with the fabric then a traditional rigid enclosure. The systems and methods described herein provide a reliable solution that is easily manufactured, which enables easy implementation within a traditional garment supply chain.

The following description and the drawings sufficiently illustrate specific embodiments to enable those skilled in the an to understand the specific embodiment. Other embodiments may incorporate structural, logical, electrical, process, and other changes. Portions and features of various embodiments may be included in, or substituted for, those of other embodiments. Embodiments set forth in the claims encompass all available equivalents of those claims.

Figure 1:
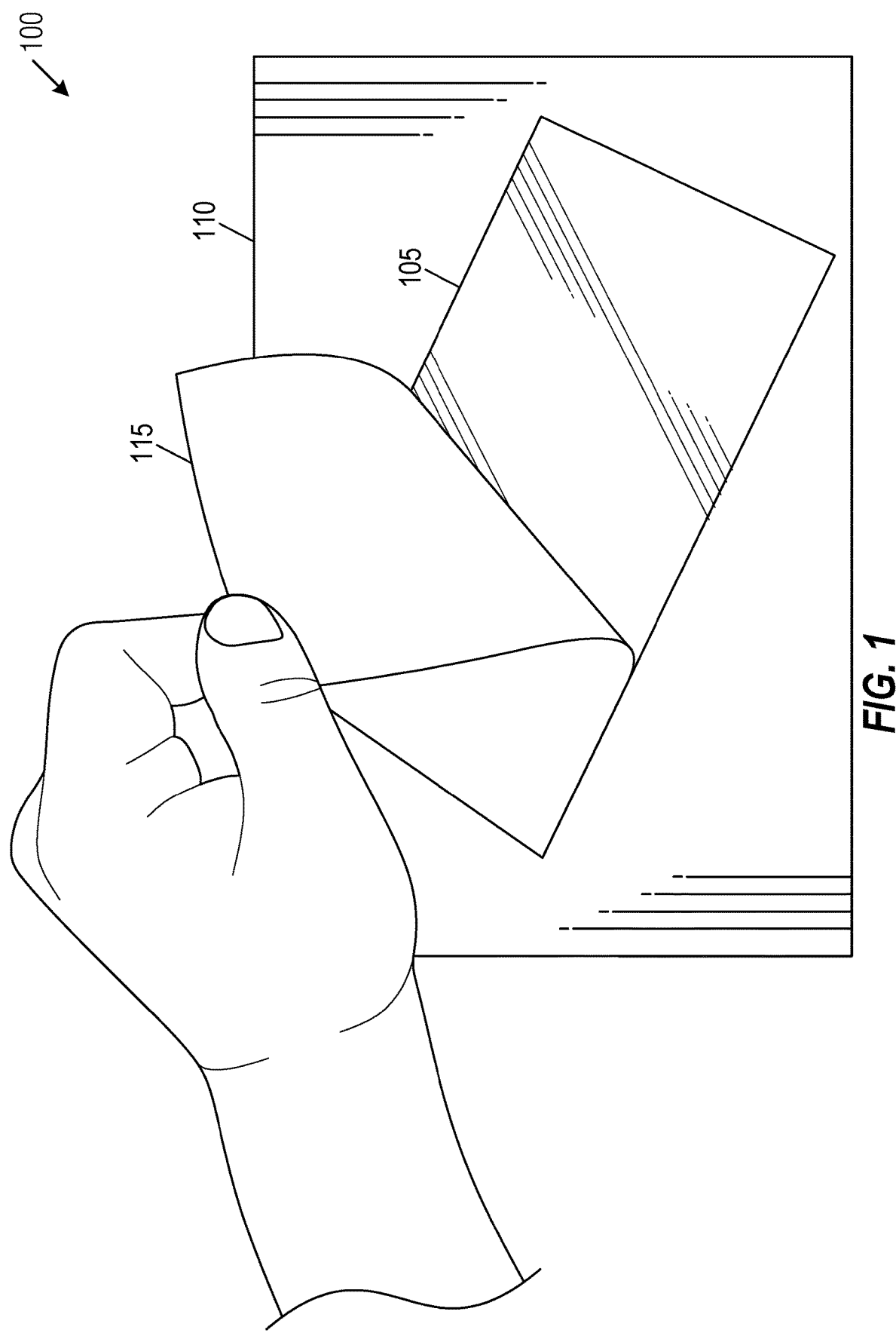
FIG. 1 is a diagram of a waterproof material attachment step, in accordance with at least one embodiment.

FIG. 1 is a diagram of a waterproof material attachment step 100, in accordance with at least one embodiment. In an embodiment, step 100 includes attaching a flexible and waterproof material 105 to a garment 110. Material 105 may include an adhesive on one side, and the material 105 may be attached to the garment 110 using heat and pressure. Once applied, the material 105 provides a flexible and waterproof barrier between the garment 110 and flexible electronic components applied in subsequent steps. Step 100 includes attaching a double-sided and non-conductive adhesive (e.g., bonding tape) 115 to the material 105. The adhesive 115 may be disposed initially on a backing, and the adhesive 115 may be attached to the material 105 by placing the backing and adhesive 115 on the material 105 and applying heat and pressure. Once the adhesive 115 is applied to the material 105, the backing may be removed. In another embodiment, waterproofing may be applied in liquid form. If the underlying garment 110 already includes a water-resistant or waterproof barrier, then step 100 may be omitted.

Figure 2:
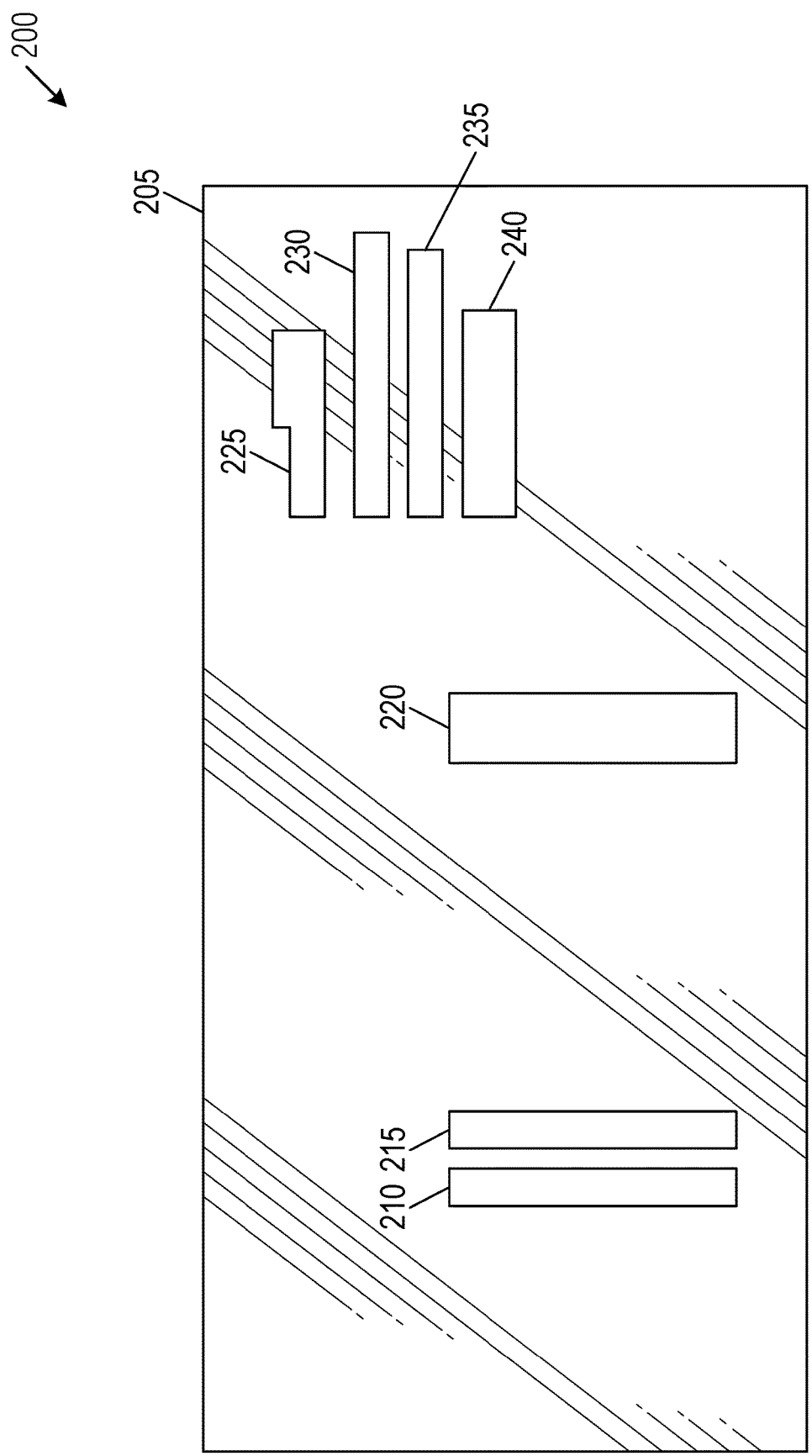
FIG. 2 is a diagram of a conductive fabric attachment step, in accordance with at least one embodiment.

FIG. 2 is a diagram of a conductive fabric attachment step 200, in accordance with at least one embodiment. Material 205 includes the flexible and waterproof material 105 and adhesive 115 applied in step 100. In step 200, conductive fabric leads 210, 215, 220, 225, 230, 235, and 240 are cut into electrical leads of desired size and shape. Each of these conductive fabric leads 210-240 are placed on the material 205, and may be adhered to the material 205 using heat and pressure.

Figure 3:
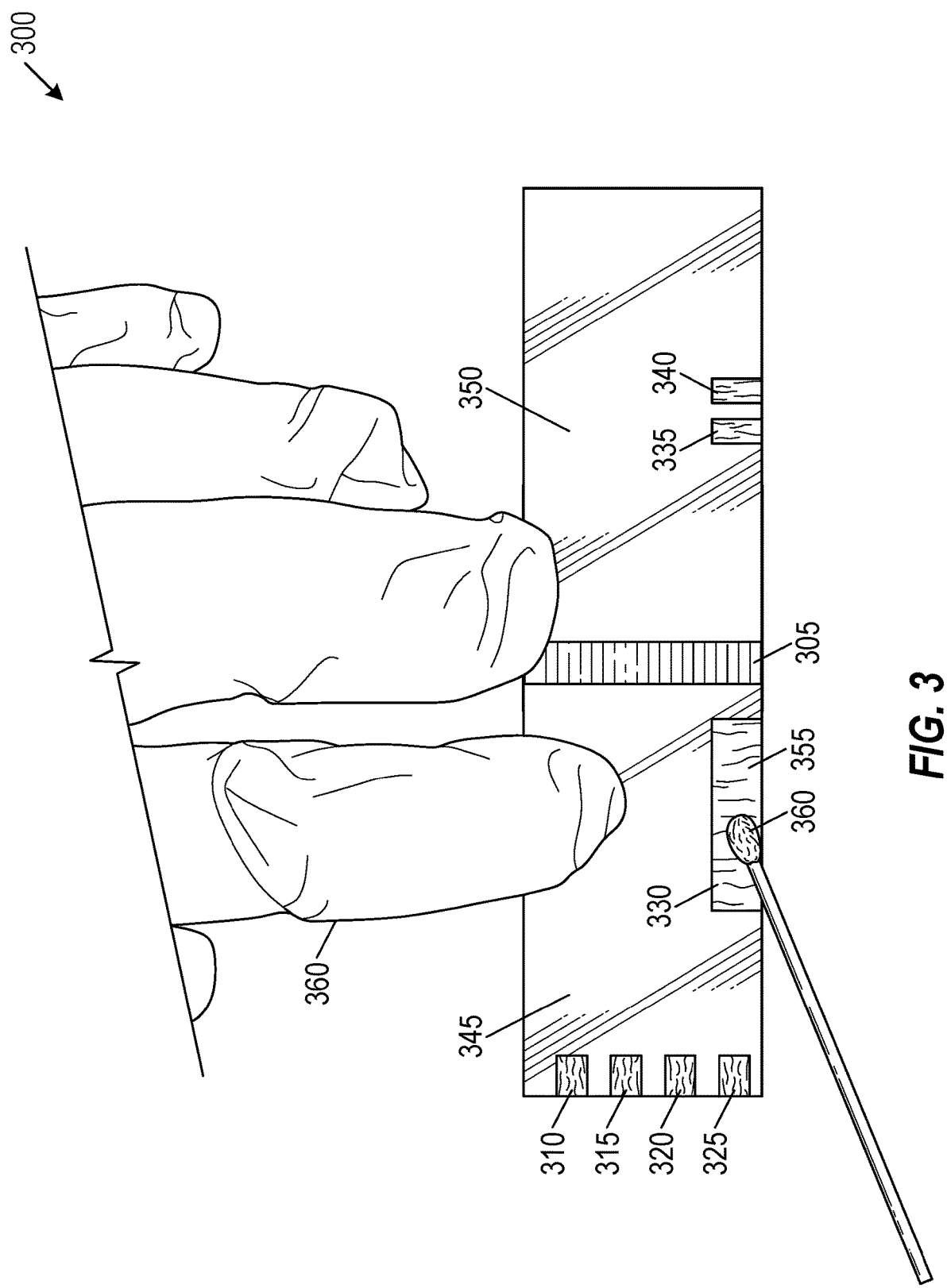
FIG. 3 is a diagram of an adhesive film mask step, in accordance with at least one embodiment.

FIG. 3 is a diagram of an adhesive film mask step 300, in accordance with at least one embodiment. Mask 345 includes cutouts (e.g., negative space) 310, 315, 320, 325, and 330, which may be cut using a laser cutter, a die cutter, or other film removal method. The cutouts 310-330 correspond to electrical connection points on a reverse side (e.g., bottom) of underlying electronic components 305. A single mask 345 may be used, or one or more additional masks 350 may be applied to the electronic components 305, and may include additional cutouts 335 and 340.

The cutouts 310-340 provide a mask through which a conductive adhesive 355 is applied to the bottom of the underlying electronic components 305. The conductive adhesive 355 may be deposited using a conductive adhesive applicator 360, a screen printing process, or other adhesive disposition method. The conductive adhesive 355 may include a conductive epoxy, a conductive glue, a joint-reinforced conductive paste, or other conductive viscous adhesive. The conductive adhesive 355 may include a low-temperature solder, and may be applied in solid form and subsequently reflowed to create a mechanical and electrical connection. The conductive adhesive 355 may include a conductive film or paste, such as an anisotropic conductive film or paste. The conductive adhesive 355 may be deposited directly in specific areas, or a stencil (e.g., adhesive mask and squeegee or adhesive mask and spray) may be used to apply the conductive adhesive 355 to the bottom of the underlying electronic components 305. The conductive adhesive 355 may be cured using ambient air, using an oven-curing process, or using a standard textile process such as ironing (e.g., application of heat and pressure). The conductive adhesive 355 may include a stretchable electrical contact, such as an adhesive and conductive fabric. The conductive adhesive 355 may include a biocompatible liquid metal alloy, such as gallium-indium, gallium-indium-tin (e.g., Galinstan), metal-hydrogel, or other biocompatible liquid metal alloy.

Masks 345 and 350 may be formed from adhesive or non-adhesive materials. A non-adhesive material may need to be held in place during application, such as using a hand 360 or a stabilizing assembly. The use of an adhesive film to form masks 345 and 350 may use existing manufacturing methodologies, and may reduce or eliminate the need for alignment using a hand 360 or a stabilizing assembly.

Figure 4:
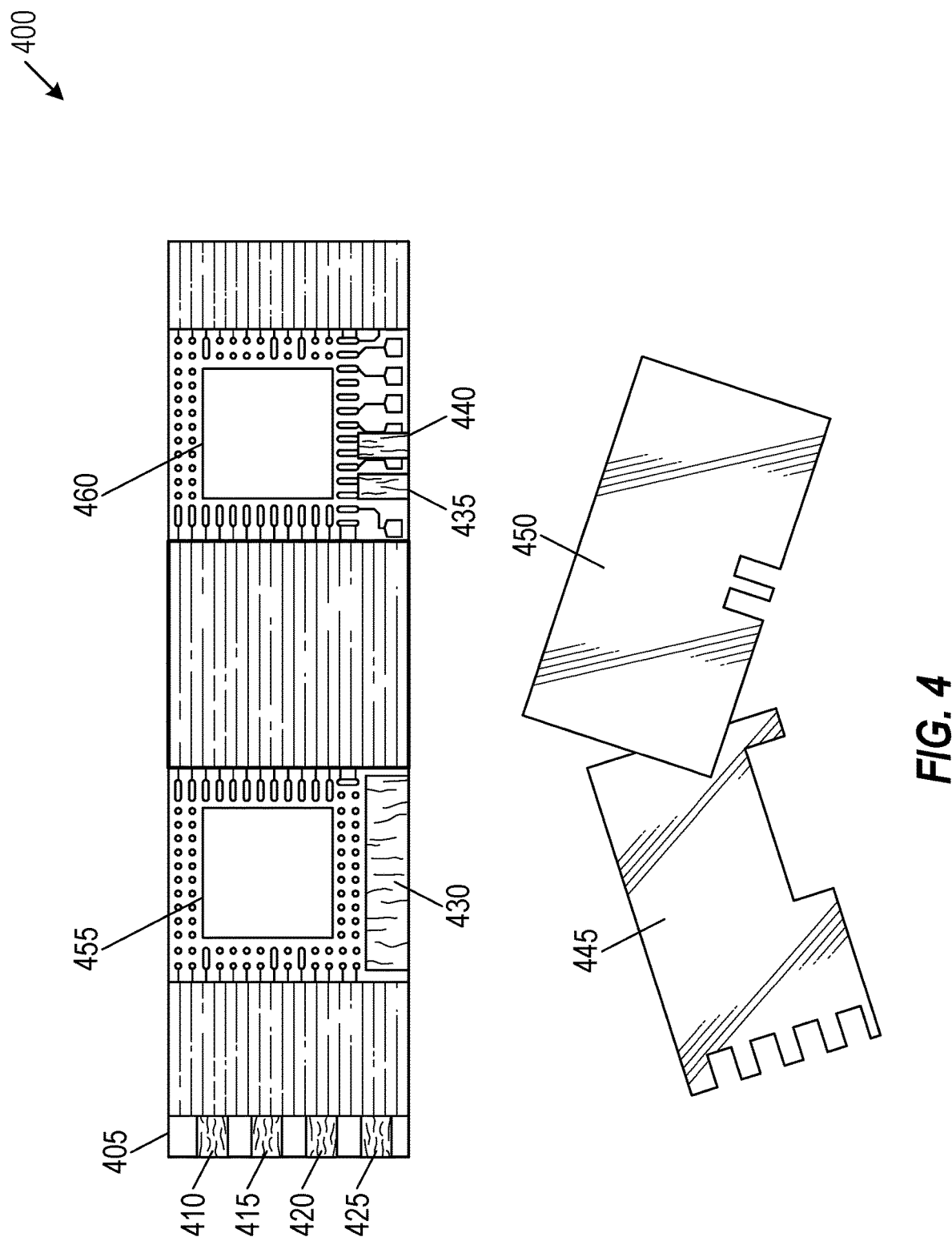
FIG. 4 is a diagram of a mask removal step, in accordance with at least one embodiment.

FIG. 4 is a diagram of a mask removal step 400, in accordance with at least one embodiment. In an embodiment, the conductive adhesive masks are cut from a non-conductive double-sided adhesive film (e.g., bonding tape), where each mask includes a non-adhesive and removable backing 445 and 450. This use of an adhesive film enables adhering the masks to electronic components 405 using heat and pressure, and the removable backing 445 and 450 removes any conductive adhesive applied beyond the perimeter of the cutouts 410-440. Electronics components 405 may be flexible, stretchable, rigid, or any combination thereof. Removal of the removable backing 445 and 450 leaves an applied layer of non-conductive adhesive on one or more underlying electronic components, such the reverse side (e.g., bottom) of underlying electronic components 455 and 460. In another embodiment, masks are cut from a non-adhesive and disposable layer, and subsequently aligned with the electronic components 405 to allow application of the conductive adhesive. When the masks are cut from a non-adhesive layer, a separate layer of adhesive is applied to the electronic components 405 after removal of the masks. The adhesive may be applied to the electronic components 405 in liquid form, such as using a stencil (e.g., adhesive mask and squeegee or adhesive mask and spray). The adhesive may be cured using ambient air, using an oven-curing process, or using a standard textile process such as ironing (e.g., application of heat and pressure).

Figure 5:
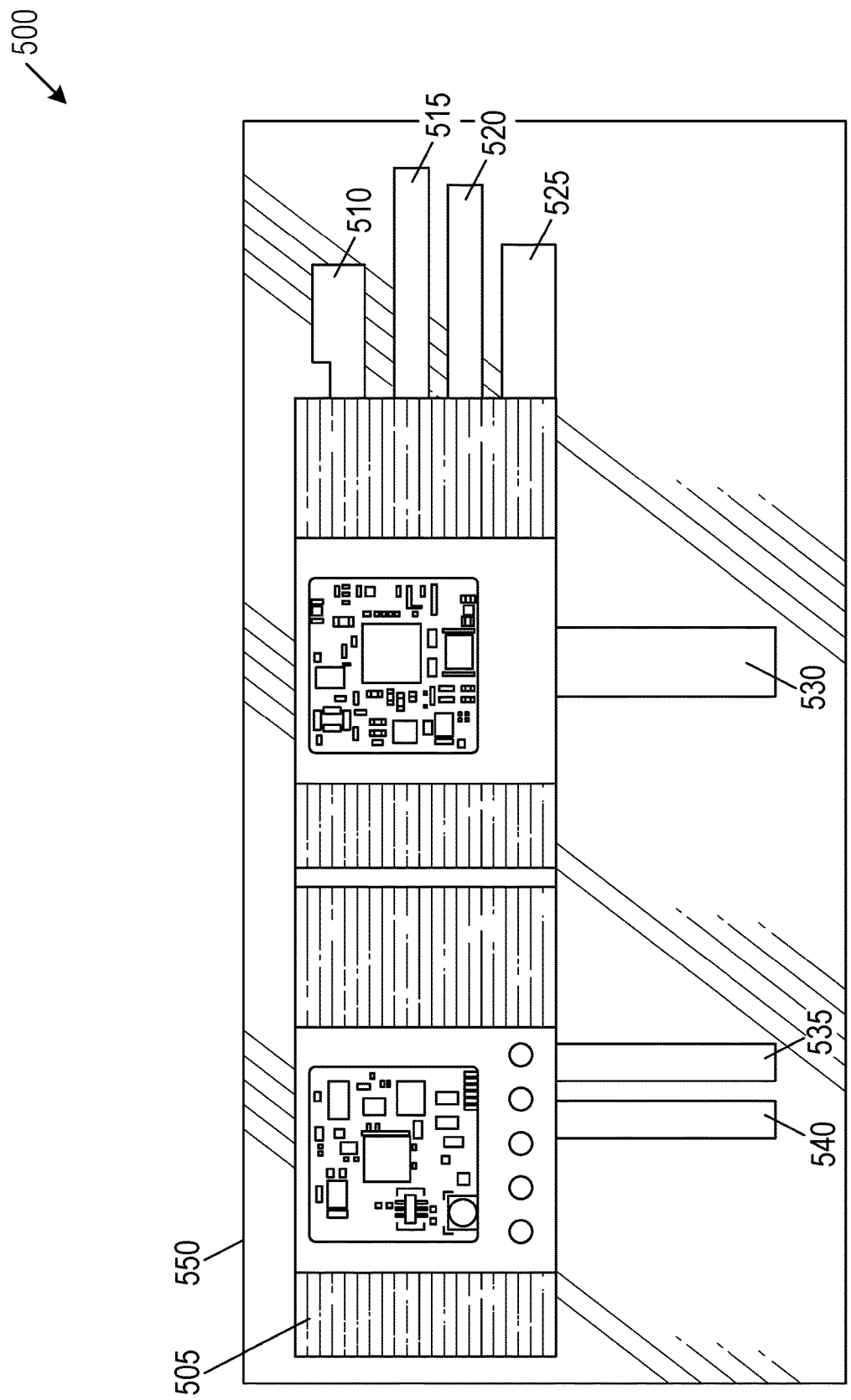
FIG. 5 is a diagram of an electronic placement step, in accordance with at least one embodiment.

FIG. 5 is a diagram of an electronic placement step 500, in accordance with at least one embodiment. Following mask removal step 400, the electronic component assembly 505 is flipped to apply the adhesive side to an underlying flexible and stretchable material 550. The masked conductive adhesive applied in adhesive film mask step 300 is aligned with corresponding conductive fabric leads 510-540. The electronic component assembly 505 may be attached to the underlying material 550 based on the type of adhesive film and conductive adhesive, such as using heat and pressure to cure conductive epoxy.

Figure 6:
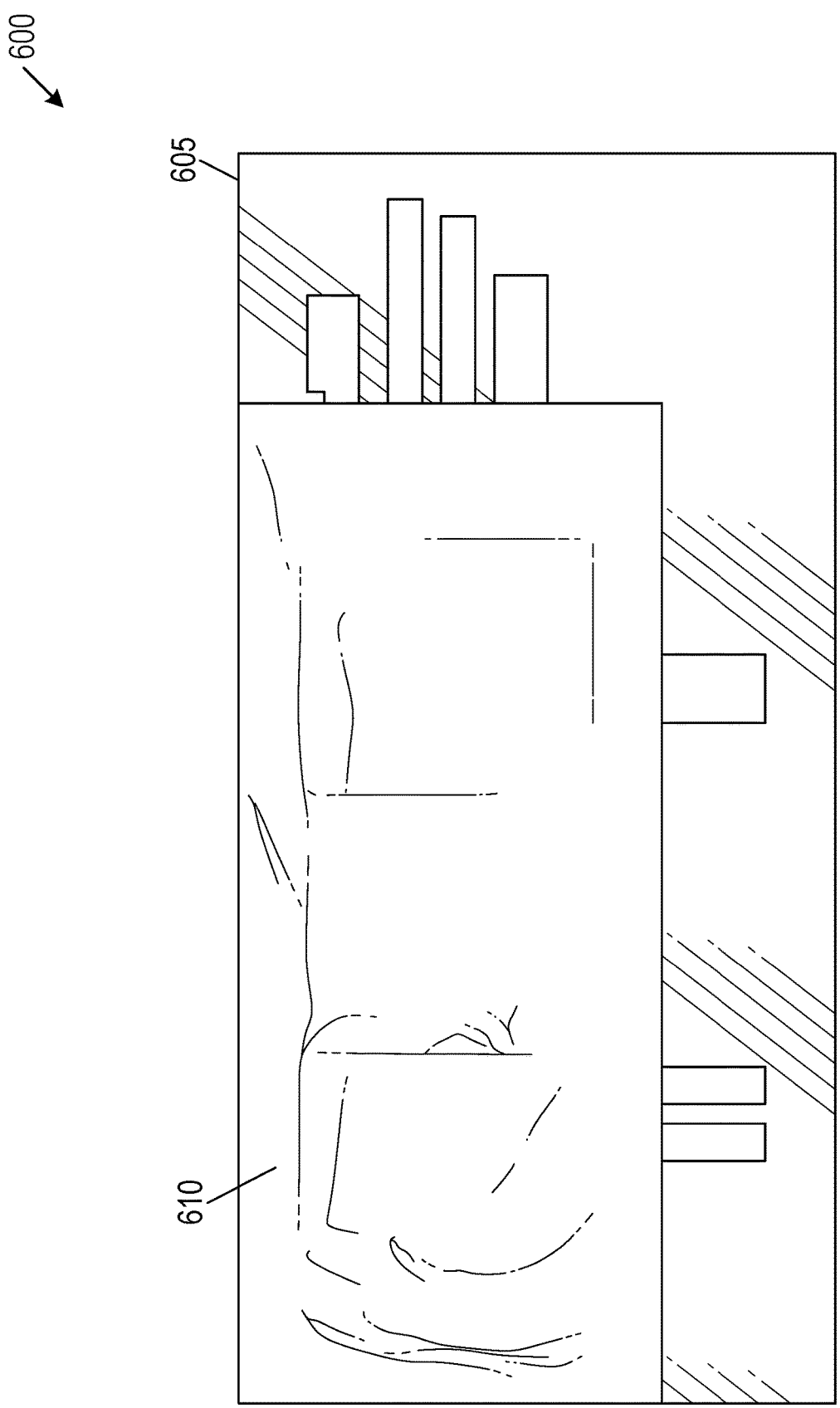
FIG. 6 is a diagram of waterproof layer application step, in accordance with at least one embodiment.

FIG. 6 is a diagram of waterproof layer application step 600, in accordance with at least one embodiment. Following application and curing adhesive film and conductive adhesive in electronic placement step 500, a flexible and stretchable waterproof material 610 is applied to the electronic component assembly 605. The waterproof material 610 may include a waterproof fabric, an applied plastic such as thermoplastic polyurethane (TPU), or another waterproof material. An adhesive may be used to secure the waterproof material 610, or the waterproof material 610 may be secured to the electronic component assembly 605, such as being laminated using heat and pressure. The waterproof material 610 may be applied using a metal or plastic mold that causes the waterproof material 610 to conform closely to the electronic component assembly 605, thereby providing an improved, watertight seal. The waterproof material 610 may also be sprayed on or deposited using a mask. In an embodiment, the electronic component assembly 605 may be manufactured to include a waterproof upper layer, in which case step 600 may be omitted.

Figure 7:
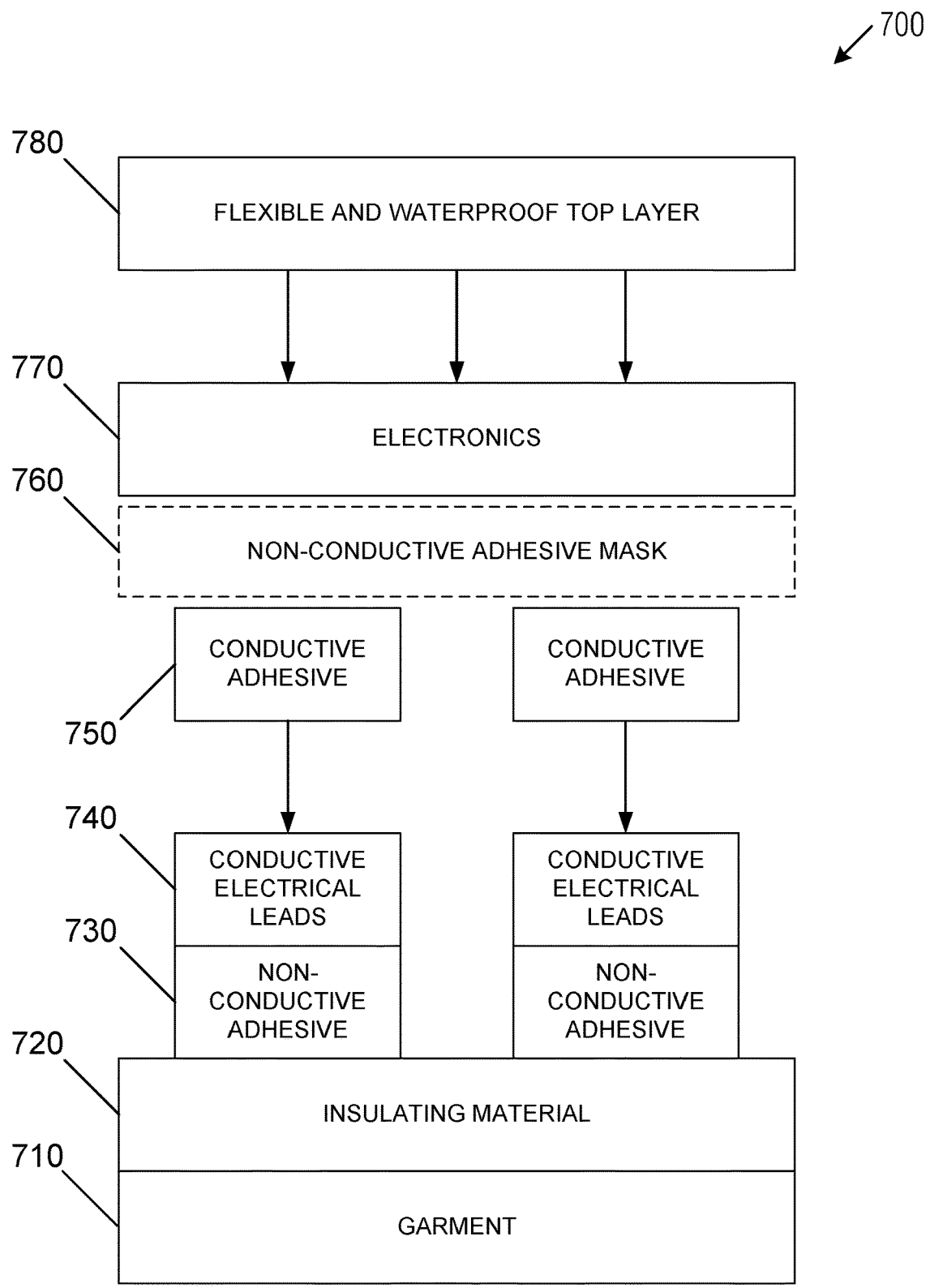
FIG. 7 is a block diagram of flexible electronics assembly, in accordance with at least one embodiment.

FIG. 7 is a block diagram of flexible and stretchable electronics assembly 700, in accordance with at least one embodiment. Assembly 700 may be formed using various embodiments, such as embodiments described in steps 100-600. In an embodiment, assembly 700 includes a flexible insulating material 720 attached to a garment 710. The flexible insulating material 720 provides a backing and insulation for subsequently applied flexible electronic components, and may be also include a stretchable material. Garment 710, insulating material 720, or both may be selected to provide a waterproof barrier. Assembly 700 includes a double-sided and nonconductive adhesive 730 applied to one side of the insulating material 720 in locations corresponding to the placement of conductive electrical leads 740. Conductive fabric is cut into electrical leads 740, which are placed in specific locations on the nonconductive adhesive 730. In various alternative embodiments, various other types of conductive leads (e.g., conductive interconnect) may be used. For example, the conductive leads may be formed using sewn-in or embroidered conductive thread, conductive ink screen printed onto the fabric, a wire coated in an insulating material and attached to a fabric, or other fabric-mounted or textile-mounted conductive leads.

Assembly 700 includes an electronics layer 770. A non-conductive adhesive mask 760 is applied to the electronics layer 770, and conductive adhesive 750 is applied through one or more cutouts within mask 760 onto the electronics layer 770. The mask 760 is removed, and the electronics layer 770 and conductive adhesive 750 are applied to the conductive electrical leads 740. If electronics 770 do not already include a waterproof upper coating, a flexible and waterproof material 780 is applied to protect the electronics layer 770.

Figure 8:
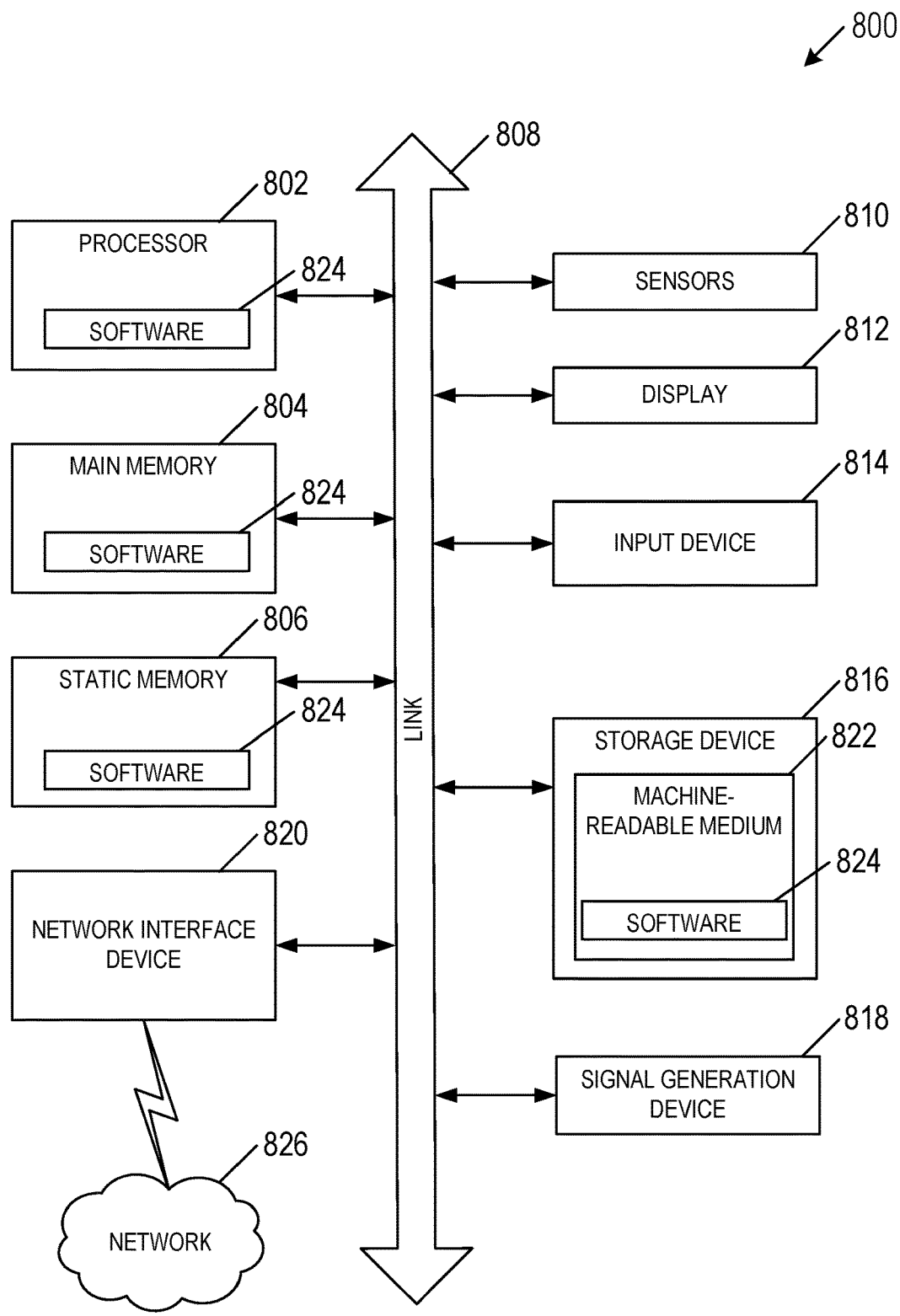
FIG. 8 is a block diagram illustrating an electronic textile device in the example form of an electronic device, according to an example embodiment.

FIG. 8 is a block diagram illustrating an electronic textile device in the example form of an electronic device 800, within which a set or sequence of instructions may be executed to cause the machine to perform any one of the methodologies discussed herein, according to an example embodiment. In alternative embodiments, the electronic device 800 operates as a standalone device or may be connected (e.g., networked) to other machines. In a networked deployment, the electronic device 800 may operate in the capacity of either a server or a client machine in server-client network environments, or it may act as a peer machine in peer-to-peer (or distributed) network environments. The electronic device 800 may be an integrated circuit (IC), a portable electronic device, a personal computer (PC), a tablet PC, a hybrid tablet, a personal digital assistant (PDA), a mobile telephone, or any electronic device 800 capable of executing instructions (sequential or otherwise) that specify actions to be taken by that machine to detect a user input. Further, while only a single electronic device 800 is illustrated, the terms "machine" or "electronic device" shall also be taken to include any collection of machines or devices that individually or jointly execute a set (or multiple sets) of instructions to perform any one or more of the methodologies discussed herein. Similarly, the term "processor-based system" shall be taken to include any set of one or more machines that are controlled by or operated by a processor (e.g., a computer) to execute instructions, individually or jointly, to perform any one or more of the methodologies discussed herein.

Example electronic device 800 includes at least one processor 802 (e.g., a central processing unit (CPU), a graphics processing unit (GPU) or both, processor cores, compute nodes, etc.), a main memory 804 and a static memory 806, which communicate with each other via a link 808 (e.g., bus). In an example, the "processor-based system" includes a system with a single processor 802 or a system with multiple processors functioning as nodes within a distributed network, Where the nodes are located in different parts of the garment. The electronic device 800 may further include a display unit 812, where the display unit 812 may include a single component that provides a user-readable display and a protective layer, or another display type. The electronic device 800 may further include an input device 814, such as a microphone, a pushbutton, a keyboard, an NFC card reader, or a user interface (UI) navigation device (e.g., a mouse or touch-sensitive input). The electronic device 800 may additionally include a storage device 816, such as a drive unit. The electronic device 800 may additionally include a signal generation device 818 to provide audible or visual feedback, such as a speaker to provide an audible feedback or one or more LEDs to provide a visual feedback. The electronic device 800 may include a network interface device 820. The electronic device 800 may additionally include one or more additional sensors 810, such as a global positioning system (GPS) sensor, compass, accelerometer, inertial measurement unit, biometric sensor, or other sensor. Multiple sensors 810 may be function independently or in conjunction, such as using multiple sensor nodes attached in various locations to the same garment or textile.

The storage device 816 includes a machine-readable medium 822 on which is stored one or more sets of data structures and instructions 824 (e.g., software) embodying or utilized by any one or more of the methodologies or functions described herein. The instructions 824 may also reside, completely or at least partially, within the main memory 804, static memory 806, and/or within the processor 802 during execution thereof by the electronic device 800. The main memory 804, static memory 806, and the processor 802 may also constitute machine-readable media.

While the machine-readable medium 822 is illustrated in an example embodiment to be a single medium, the term "machine-readable medium" may include a single medium or multiple media (e.g., a centralized or distributed database, and/or associated caches and servers) that store the one or more instructions 824. The term "machine-readable medium" shall also be taken to include any tangible medium that is capable of storing, encoding or carrying instructions for execution by the machine and that cause the machine to perform any one or more of the methodologies of the present disclosure or that is capable of storing, encoding or carrying data structures utilized by or associated with such instructions. The term "machine-readable medium" shall accordingly be taken to include, but not be limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks.

The instructions 824 may further be transmitted or received over a communications network 826 using a transmission medium via the network interface device 820 utilizing any one of a number of well-known transfer protocols (e.g., HTTP). Examples of communication networks include a local area network (LAN), a wide area network (WAN), the Internet, mobile telephone networks, and wireless data networks (e.g., Wi-Fi, NFC, Bluetooth, Bluetooth LE, 3G, 3G LTE/LTE-A, WiMAX networks, etc.). The term "transmission medium" shall be taken to include any intangible medium that is capable of storing, encoding, or carrying instructions for execution by the machine, and includes digital or analog communications signals or other intangible medium to facilitate communication of such software.

To better illustrate the method and apparatuses disclosed herein, a non-limiting list of embodiments is provided here.

Example 1 is a stretchable and flexible electronic apparatus comprising: a waterproof insulating layer attached to a garment; a plurality of flexible conductive leads attached to the waterproof material; and an electronics assembly attached to the waterproof material, the plurality of flexible conductive leads mechanically and conductively coupled to a corresponding plurality of electronics contacts on the electronics assembly.

In Example 2, the subject matter of Example 1 optionally includes the electronics assembly including at least one of a flexible electronics assembly, a stretchable electronics assembly, and a rigid electronics assembly.

In Example 3, the subject matter of any one or more of Examples 1-2 optionally include a conductive adhesive disposed through a plurality of cutouts of a removable mask onto predetermined conductive portions of the electronics assembly, the predetermined conductive portions corresponding to the plurality of flexible conductive leads.

In Example 4, the subject matter of Example 3 optionally includes a non-conductive electronics adhesive layer disposed on the electronics assembly by the removable mask.

In Example 5, the subject matter of any one or more of Examples 3-4 optionally include wherein the conductive adhesive provides the mechanical and conductive coupling between the plurality of flexible conductive leads and the corresponding plurality of electronics contacts on the electronics assembly, In Example 6, the subject matter of any one or more of Examples 3-5 optionally include wherein the conductive adhesive includes at least one of a conductive epoxy, a conductive glue, and a joint-reinforced conductive paste.

In Example 7, the subject matter of any one or more of Examples 3-6 optionally include wherein the conductive adhesive includes a low-temperature solder, the low-temperature solder applied in solid form and subsequently reflowed to provide the mechanical and conductive coupling.

In Example 8, the subject matter of any one or more of Examples 3-7 optionally include wherein the conductive adhesive includes a biocompatible liquid metal alloy.

In Example 9, the subject matter of any one or more of Examples 1-8 optionally include a flexible waterproof upper layer attached to the electronics assembly.

In Example 10, the subject matter of Example 9 optionally includes an upper non-conductive adhesive layer disposed between the flexible waterproof upper layer and the electronics assembly.

In Example 11, the subject matter of any one or more of Examples 1-10 optionally include a lower non-conductive adhesive layer disposed between the plurality of flexible conductive leads and the waterproof insulating layer.

Example 12 is a stretchable and flexible electronic method comprising: attaching a waterproof insulating layer to a garment; attaching a plurality of flexible conductive leads to the waterproof material; and attaching an electronics assembly to the waterproof material, the plurality of flexible conductive leads mechanically and conductively coupled to a corresponding plurality of electronics contacts on the electronics assembly.

In Example 13, the subject matter of Example 12 optionally includes the electronics assembly including at least one of a flexible electronics assembly, a stretchable electronics assembly, and a rigid electronics assembly.

In Example 14, the subject matter of any one or more of Examples 12-13 optionally include disposing a removable mask on the electronics assembly; disposing a conductive adhesive through the plurality of cutouts onto predetermined conductive portions of the electronics assembly, the predetermined conductive portions corresponding to the plurality of flexible conductive leads; and removing the removable mask from the electronics assembly.

In Example 15, the subject matter of Example 14 optionally includes disposing a non-conductive electronics adhesive layer on the electronics assembly.

In Example 16, the subject matter of Example 15 optionally includes wherein: the removable mask includes the non-conductive electronics adhesive layer; and the non-conductive electronics adhesive layer is disposed on the electronics assembly by disposing the removable mask and removing the removable mask from the electronics assembly.

In Example 17, the subject matter of any one or more of Examples 14-16 optionally include wherein the conductive adhesive provides the mechanical and conductive coupling between the plurality of flexible conductive leads and the corresponding plurality of electronics contacts on the electronics assembly.

In Example 18, the subject matter of any one or more of Examples 14-17 optionally include wherein disposing the conductive adhesive includes disposing at least one of a conductive epoxy, a conductive glue, and a joint-reinforced conductive paste.

In Example 19, the subject matter of any one or more of Examples 14-18 optionally include wherein disposing the conductive adhesive includes disposing a low-temperature solder in solid form, the method further including reflowing the low-temperature solder to provide the mechanical and conductive coupling.

In Example 20, the subject matter of any one or more of Examples 14-19 optionally include wherein disposing the conductive adhesive includes disposing a biocompatible liquid metal alloy.

In Example 21, the subject matter of any one or more of Examples 12-20 optionally include attaching a flexible waterproof upper layer to the electronics assembly.

In Example 22, the subject matter of Example 21 optionally includes disposing an upper non-conductive adhesive layer between the flexible waterproof upper layer and the electronics assembly.

In Example 23, the subject matter of any one or more of Examples 12-22 optionally include disposing a lower non-conductive adhesive layer between the plurality of flexible conductive leads and the waterproof insulating layer.

Example 24 is at least one machine-readable medium including instructions, which when executed by a computing system, cause the computing system to perform any of the methods of Examples 12-23.

Example 25 is an apparatus comprising means for performing any of the methods of Examples 12-23.

Example 26 is at least one machine-readable storage medium, comprising a plurality of instructions that, responsive to being executed with processor circuitry of a computer-controlled device, cause the computer-controlled device to: attach a waterproof insulating layer to a garment; attach an plurality of flexible conductive leads to the waterproof material; and attach an electronics assembly to the waterproof material, the plurality of flexible conductive leads mechanically and conductively coupled to a corresponding plurality of electronics contacts on the electronics assembly.

In Example 27, the subject matter of Example 26 optionally includes the electronics assembly including at least one of a flexible electronics assembly, a stretchable electronics assembly, and a rigid electronics assembly, In Example 28, the subject matter of any one or more of Examples 26-27 optionally include the instructions further causing the computer-controlled device to: disposing a removable mask on the electronics assembly; disposing a conductive adhesive through the plurality of cutouts onto predetermined conductive portions of the electronics assembly, the predetermined conductive portions corresponding to the plurality of flexible conductive leads; and removing the removable mask from the electronics assembly.

In Example 29, the subject matter of Example 28 optionally includes the instructions further causing the computer-controlled device to disposing a non-conductive electronics adhesive layer on the electronics assembly.

In Example 30, the subject matter of Example 29 optionally includes wherein: the removable mask includes the non-conductive electronics adhesive layer; and the non-conductive electronics adhesive layer is disposed on the electronics assembly by disposing the removable mask and removing the removable mask from the electronics assembly.

In Example 31, the subject matter of any one or more of Examples 28-30 optionally include wherein the conductive adhesive provides the mechanical and conductive coupling between the plurality of flexible conductive leads and the corresponding plurality of electronics contacts on the electronics assembly.

In Example 32, the subject matter of any one or more of Examples 28-31 optionally include wherein the conductive adhesive includes at least one of a conductive epoxy, a conductive glue, and a joint-reinforced conductive paste.

In Example 33, the subject matter of any one or more of Examples 28-32 optionally include wherein the conductive adhesive includes a low-temperature solder in solid form, the instructions further causing the computer-controlled device to reflowing the low-temperature solder to provide the mechanical and conductive coupling.

In Example 34, the subject matter of any one or more of Examples 28-33 optionally include wherein the conductive adhesive includes a biocompatible liquid metal alloy.

In Example 35, the subject matter of any one or more of Examples 26-34 optionally include the instructions further causing the computer-controlled device to attach a flexible waterproof upper layer to the electronics assembly.

In Example 36, the subject matter of Example 35 optionally includes the instructions further causing the computer-controlled device to dispose an upper non-conductive adhesive layer between the flexible waterproof upper layer and the electronics assembly.

In Example 37, the subject matter of any one or more of Examples 26-36 optionally include the instructions further causing the computer-controlled device to dispose a lower non-conductive adhesive layer between the plurality of flexible conductive leads and the waterproof insulating layer.

Example 38 is a stretchable and flexible electronic apparatus comprising: means for attaching a waterproof insulating layer to a garment; means for attaching a plurality of flexible conductive leads to the waterproof material and means for attaching an electronics assembly to the waterproof material, the plurality of flexible conductive leads mechanically and conductively coupled to a corresponding plurality of electronics contacts on the electronics assembly.

In Example 39, the subject matter of Example 38 optionally includes the electronics assembly including at least one of a flexible electronics assembly, a stretchable electronics assembly, and a rigid electronics assembly.

In Example 40, the subject matter of any one or more of Examples 38-39 optionally include means for disposing a removable mask on the electronics assembly; means for disposing a conductive adhesive through the plurality of cutouts onto predetermined conductive portions of the electronics assembly, the predetermined conductive portions corresponding to the plurality of flexible conductive leads; and means for removing the removable mask from the electronics assembly.

In Example 41, the subject matter of Example 40 optionally includes means for disposing a non-conductive electronics adhesive layer on the electronics assembly.

In Example 42, the subject matter of Example 41 optionally includes wherein: the removable mask includes the non-conductive electronics adhesive layer; and the non-conductive electronics adhesive layer is disposed on the electronics assembly by disposing the removable mask and removing the removable mask from the electronics assembly.

In Example 43, the subject matter of any one or more of Examples 40-42 optionally include wherein the conductive adhesive provides the mechanical and conductive coupling between the plurality of flexible conductive leads and the corresponding plurality of electronics contacts on the electronics assembly.

In Example 44, the subject matter of any one or more of Examples 40-43 optionally include wherein the conductive adhesive includes at least one of a conductive epoxy, a conductive glue, and a joint-reinforced conductive paste.

In Example 45, the subject matter of any one or more of Examples 40-44 optionally include wherein the conductive adhesive includes disposing a low-temperature solder in solid form, the apparatus further including means for reflowing the low-temperature solder to provide the mechanical and conductive coupling.

In Example 46, the subject matter of any one or more of Examples 40-45 optionally include wherein the conductive adhesive includes a biocompatible liquid metal alloy.

In Example 47, the subject matter of any one or more of Examples 38-46 optionally include means for attaching a flexible waterproof upper layer to the electronics assembly.

In Example 48, the subject matter of Example 47 optionally includes means for disposing an upper non-conductive adhesive layer between the flexible waterproof upper layer and the electronics assembly.

In Example 49, the subject matter of any one or more of Examples 38-48 optionally include means for disposing a lower non-conductive adhesive layer between the plurality of flexible conductive leads and the waterproof insulating layer.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to ascertain quickly the nature of the technical disclosure. It is submitted with the understanding that it will not be used to interpret or limit the scope or meaning of the claims. In the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope should be determined with reference to the appended claims, along with the full scope of equivalents to which such claims are entitled.

What is claimed is:

1. A method of forming a stretchable and flexible electronic garment, the method comprising:
    attaching a waterproof insulating layer to a garment;
    attaching a plurality of flexible conductive leads to the waterproof insulating layer;
    disposing a removable mask on an electronics assembly;
    disposing a conductive adhesive through a plurality of cutouts onto predetermined conductive portions of the electronics assembly, the predetermined conductive portions corresponding to the plurality of flexible conductive leads;
    removing the removable mask from the electronics assembly; and
    attaching the electronics assembly to the waterproof insulating layer, the plurality of flexible conductive leads mechanically and conductively coupled to a corresponding plurality of electronics contacts on the electronics assembly.

2. The method of claim 1, wherein the electronics assembly includes at least one of a flexible electronics assembly, a stretchable electronics assembly, and a rigid electronics assembly.

3. The method of claim 1, further including disposing a non-conductive electronics adhesive layer on the electronics assembly.

4. The method of claim 3, wherein:
    the removable mask includes the non-conductive electronics adhesive layer; and
    the non-conductive electronics adhesive layer is disposed on the electronics assembly by disposing the removable mask and removing the removable mask from the electronics assembly.

5. The method of claim 1, wherein the conductive adhesive provides a mechanical and conductive coupling between the plurality of flexible conductive leads and the corresponding plurality of electronics contacts on the electronics assembly.

6. The method of claim 5, wherein disposing the conductive adhesive includes disposing a low-temperature solder in solid form, the method further including reflowing the low-temperature solder to provide the mechanical and conductive coupling.

7. The method of claim 1, wherein disposing the conductive adhesive includes disposing at least one of a conductive epoxy, a conductive glue, and a joint-reinforced conductive paste.

8. The method of claim 1, wherein disposing the conductive adhesive includes disposing a biocompatible liquid metal alloy.

9. The method of claim 1, further including attaching a flexible waterproof upper layer to the electronics assembly.

10. The method of claim 9, further including disposing an upper non-conductive adhesive layer between the flexible waterproof upper layer and the electronics assembly.

11. The method of claim 1, further including disposing a lower non-conductive adhesive layer between the plurality of flexible conductive leads and the waterproof insulating layer.

* * * * *